US005710435A

United States Patent [19]

Niigaki et al.

[11] Patent Number: 5,710,435

[45] Date of Patent: Jan. 20, 1998

[54] PHOTOMULTIPLIER HAVING A PHOTOCATHODE COMPRISED OF SEMICONDUCTOR MATERIAL

[75] Inventors: Minoru Niigaki; Toru Hirohata; Tomoko Suzuki; Masami Yamada, all of Hamamatsu, Japan

[73] Assignee: Hamamatsu Photonics K.K., Hamamatsu, Japan

[21] Appl. No.: 580,057

[22] Filed: Dec. 20, 1995

Related U.S. Application Data

[63] Continuation-in-part of Ser. No. 507,985, Jul. 27, 1995.

[30] Foreign Application Priority Data

Dec. 21, 1994 [JP] Japan .................................... 6-318182

[51] Int. Cl.[6] .............................. H01L 29/06; H01L 29/12

[52] U.S. Cl. .............................. 257/11; 257/10; 257/184; 257/185; 313/366; 313/367; 313/542; 313/346 R

[58] Field of Search ................................ 257/10, 11, 184, 257/185; 313/366, 367, 542, 346 R

[56] References Cited

U.S. PATENT DOCUMENTS

| | | |
|---|---|---|
| 3,958,143 | 5/1976 | Bell . |
| 5,047,199 | 9/1991 | Costello et al. . |
| 5,336,902 | 8/1994 | Nigaki et al. . |
| 5,404,026 | 4/1995 | Marsella, Jr. et al. .................... 257/10 |
| 5,591,986 | 1/1997 | Niigaki et al. ........................... 257/10 |

FOREIGN PATENT DOCUMENTS

| | | |
|---|---|---|
| 4-269419 | 9/1992 | Japan . |
| 5-234501 | 9/1993 | Japan . |

*Primary Examiner*—Ngân V. Ngô

*Attorney, Agent, or Firm*—Cushman Darby & Cushman IP Group of Pillsbury Madison & Sutro LLP

[57] ABSTRACT

A photoelectric emission surface which is excellent in stability and reproducibility of photoelectric conversion characteristics and has a structure capable of obtaining a high photosensitivity is provided. A predetermined voltage is applied between an upper surface electrode and a lower surface electrode by a battery. Upon application of this voltage, a p-n junction formed between a contact layer and an electron emission layer is reversely biased. A depletion layer extends from the p-n junction into the photoelectric emission surface, and an electric field is formed in the electron emission layer and a light absorbing layer in a direction for accelerating photoelectrons. When incident light is absorbed in the light absorbing layer to excite photoelectrons, the photoelectrons are accelerated by the electric field toward the emission surface. The photoelectrons obtain an energy upon this electric field acceleration, and are transited, in the electron emission layer, to a conduction band at a higher energy level, and emitted into a vacuum.

23 Claims, 13 Drawing Sheets

PHOTOMULTIPLIER HAVING A PHOTOCATHODE COMPRISED OF SEMICONDUCTOR MATERIAL

RELATED APPLICATIONS

This is a continuation-in-part application of application Ser. No. 08/507,985 filed on Jul. 27, 1995, now pending.

BACKGROUND OF THE INVENTION

1. Field of the Invention

The present invention relates to a photoelectric emission surface (photocathode) for emitting photoelectrons in response to the incidence of photons, and an electron tube using the same. The electron tube is an apparatus which detects weak light using the photocathode. Photomultipliers (photoelectric conversion tubes) and its equivalents, i.e., streak tubes (streak cameras), image intensifiers and so on, are types of electron tubes.

2. Related Background Art

A photoelectric emission surface for a long wavelength is described in, e.g., U.S. Pat. No. 3,958,143. In this photoelectric emission surface, photoelectrons generated by incident light are accelerated by an electric field formed in the photoelectric emission surface, transited to a higher energy band, and emitted into a vacuum.

SUMMARY OF THE INVENTION

FIG. 9 is a sectional view schematically showing a transition electron type photoelectric emission surface. A light absorbing layer 2 and a electron emitting layer 3 are stacked on a semiconductor substrate 1. A thin-film Schottky electrode 4 having a thickness of 50 to 100 Å is formed on the surface of the electron emitting layer 3. A bias voltage is applied between this thin-film Schottky electrode 4 and an ohmic electrode 5 formed on the lower surface of the semiconductor substrate 1. Upon application of the voltage, a depletion layer extends from the thin-film Schottky electrode 4 side to the light absorbing layer 2, thereby forming a predetermined electric field in the photoelectric emission surface. Photoelectrons generated upon incidence of light are accelerated by this electric field and emitted into a vacuum.

In the photoelectric emission surface having the above structure, however, the thin-film Schottky electrode 4 is as thin as 50 to 100 Å, and it is difficult to reproduce and manufacture this thin Schottky electrode 4 at a high reproducibility. For this reason, it is difficult to obtain a photoelectric emission surface having predetermined characteristics at a high limitation. On the other hand, the performance of a photoelectric emission surface is greatly influenced by the characteristics of the thin-film Schottky electrode 4. Particularly, it may safely be said that the photosensitivity or dark current is determined by the characteristics of the Schottky electrode.

To solve the above problem and form a Schottky electrode at a high reproducibility, U.S. Pat. No. 5,047,821 discloses a photoelectric emission surface, and Japanese Patent Laid-Open No. 3-29971 discloses another photoelectric emission surface. In these prior arts, the shape of the Schottky electrode is formed into a predetermined pattern. This makes it unnecessary to form a thin-film Schottky electrode. Therefore, according to these photoelectric emission surfaces, identical Schottky electrodes can be easily formed as compared to the photoelectric emission surface disclosed in U.S. Pat. No. 3,958,143.

However, the photoelectric emission surface according to U.S. Pat. No. 5,047,821 or Japanese Patent Laid-Open No. 3-29971 is not essentially different from that according to U.S. Pat. No. 3,958,143 in that the Schottky electrode is formed on a p-type semiconductor. More specifically, the characteristics of the Schottky electrode formed on the p-type semiconductor is unstable because it is very sensitive to the interface state between the Schottky electrode and the photoelectric emission surface. For this reason, in all the above photoelectric emission surfaces, it is difficult to reproduce the desired photoelectric conversion characteristics reliably. Specially, when using such a photocathode as a so-called reflection mode photocathode which receives incident light on its electron emitting side, the photoelectric sensitivity of the photocathode is greatly decreased because the Schottky electrodes interrupt the incident light.

The present invention has been made to solve the above problem. A photomultiplier according to the present invention has a photocathode for emitting electrons in correspondence with light incident on said photocathode, wherein said photocathode comprises: (a) a substrate of a first conductivity type semiconductor; (b) a first layer (light absorbing layer) of a first conductivity type semiconductor, being in contact with said substrate; (c) a second layer (electron emitting layer) of a first conductivity type semiconductor, being in contact with said first layer; (d) a third layer (contact layer) of a second conductivity type semiconductor, being in contact with said second layer; (e) an upper surface electrode being in contact with said third layer; (f) an active layer for decreasing a work function of said second layer, being in contact with a remaining exposed surface of said second layer; and (g) a lower surface electrode being in contact with said substrate.

Using this photoelectric emission surface, a photoelectric conversion tube such as a photomultiplier, an image intensifier, and a streak tube is constituted.

When a bias voltage is applied to the upper and lower surface electrodes have ohmic contact properties, the p-n junction between the contact layer and the electron emission layer is reversely biased. Therefore, a depletion layer extends from the p-n junction portion into the photoelectric emission surface, and an electric field for accelerating the photoelectrons is formed in the photoelectric emission surface.

The contact layer has a pattern shape for almost uniformly distributing and exposing the electron emission layer. For this reason, the photoelectrons excited in the light absorbing layer are efficiently emitted into the vacuum without being impeded with their traveling near the emission surface. Further, because the upper surface electrode is formed only in a small region of the contact layer, the surface electrode does not interrupt the incident light and the transmissivity of the incident light is not decreased and the photoelectric conversion coefficient is greatly increased. The area of the small region is less than 3 $mm^2$, and the upper surface electrode is in contact with the contact layer at only this small point.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
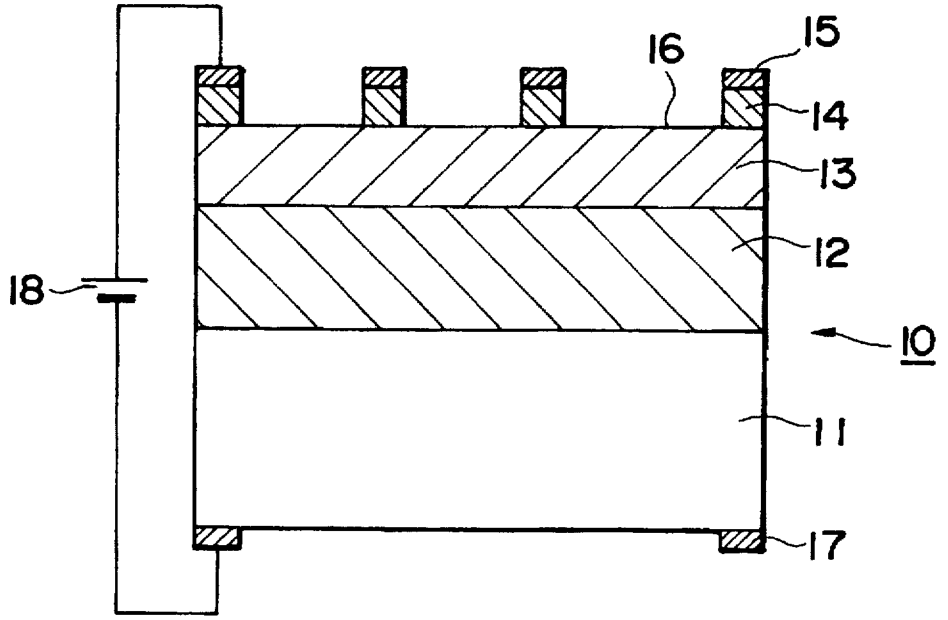
FIG. 1 is a sectional view of the photoelectric emission surface according to the first embodiment of the present invention.
Figure 10:
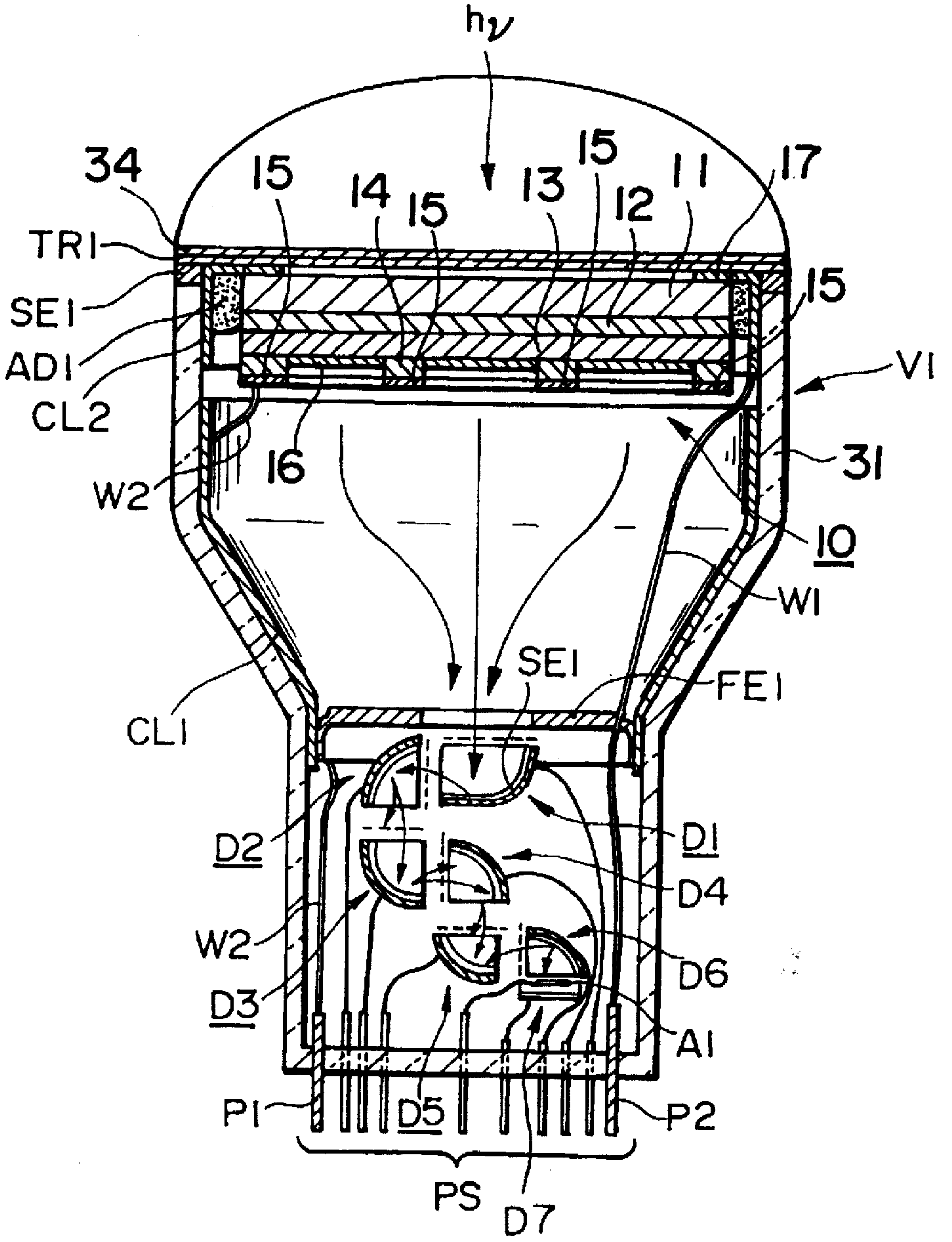
FIG. 10 is a view of a photomultiplier using a photoelectric emission surface in FIG. 1.

FIG. 1 is a sectional view schematically showing a photoelectric emission surface (photocathode) according to the first embodiment of the present invention. FIG. 10 is a view of a photomultiplier using this photocathode.

A semiconductor substrate 11 consists of InP as a Group III–V compound semiconductor material, and its conductivity type is $p^+$. A light absorbing layer 12 for absorbing incident light and generating photoelectrons is formed on the semiconductor substrate 11. The light absorbing layer 12 consists of InGaAsP as a Group III–V compound semiconductor material, and its conductivity type is $p^-$. An electron emission layer 13 for accelerating the photoelectrons toward the emission surface is formed on the light absorbing layer 12. The electron emission layer 13 also consists of InP as a Group III–V compound semiconductor material, and its conductivity type is $p^-$. A contact layer 14 which forms a p-n junction with respect to the electron emission layer 13 is formed on the electron emission layer 13. The contact layer 14 also consists of InP as a Group III–V compound semiconductor material, and its conductivity type is $n^+$.

The carrier concentrations of these layers are as follows. The semiconductor substrate 11 consisting of $p^+$-InP preferably has a carrier concentration of $1\times10^{18}$ $cm^{-8}$ or more. The light absorbing layer 12 consisting of $p^-$-InGaAsP preferably has a carrier concentration of $5\times10^{16}$ $cm^{-3}$ or less. The electron emission layer 13 consisting of $p^-$-InP preferably has a carrier concentration of $5\times10^{16}$ $cm^{-3}$ or less. The contact layer 14 consisting of $n^+$-InP preferably has a carrier concentration of $10^{18}$ $cm^{-3}$ or more. However, the carrier concentrations of these layers are not necessarily limited to these.

An upper surface electrode 15 is formed on the contact layer 14 to be in ohmic contact with the contact layer 14. The upper surface electrode 15 consists of an AuGe/Ni/Au alloy. The upper surface electrode 15 and the contact layer 14 are fabricated to have the same mesh (matrix) pattern with predetermined intervals by lithography and etching techniques. Matrix windows are formed in the mesh pattern, through which the rectangular surfaces of the electron emission layer 13 are exposed. Since this mesh pattern is regularly formed on the surface of the electron emission layer 13, the matrix windows are almost 15 uniformly distributed on the surface of the electron emission layer 13. Therefore, the rectangular surfaces of the electron emission layer 13 are almost uniformly distributed and exposed through the matrix windows. A thin Cs layer 16 is coated on the exposed surface of the electron emission layer 13. The Cs layer 16 decreases the work function on the exposed surface of the electron emission layer 13, thereby realizing a structure for easily emitting photoelectrons into the vacuum. A lower surface electrode 17 consisting of an AuGe/Ni/Au alloy is formed on the lower surface of the semiconductor substrate 11. The lower surface electrode 17 is in ohmic contact with the lower surface of the semiconductor substrate 11.

In the above structure, a predetermined bias voltage is applied between the upper surface electrode 15 and the lower surface electrode 17 by a battery 18. Upon application of the voltage, the p-n junction formed between the contact layer 14 and the electron emission layer 13 is reversely biased. Therefore, a depletion layer extends from the p-n junction portion into the photoelectric emission surface, and an electric field is formed in the electron emission layer 13 and the light absorbing layer 12 in a direction for accelerating the photoelectrons.

The photomultiplier in FIG. 1A will be described below in more detail.

The photomultiplier shown in FIG. 1A has a photocathode 10 for emitting electrons in correspondence with light incident on the photocathode 10.

The photocathode 10 has the substrate 11, the first layer 12, the second layer 13, the third layer 14, the active layer 16, the upper surface electrode 15, and the lower surface electrode 17.

The substrate 11 consists of p-type InP and has a carrier concentration $1\times10^{18}$ $cm^{-3}$ or more.

The first layer 12 consists of p-type InGaAsP, has a carrier concentration of $5\times10^{16}$ $cm^{-3}$ or less, and contacts the substrate 11.

The second layer 13 consists of p-type InP, has a carrier concentration of $5\times10^{16}$ $cm^{-3}$ or less, and contacts the first layer 12.

The third layer 14 consists of n-type InP, has a carrier concentration of $1\times10^{18}$ $cm^{-3}$ or more, and contacts the second layer 13.

The upper surface electrode 15 has a plurality of openings and contacts the third layer 14.

The active layer 16 contacts the remaining exposed surface of the second layer 13 and decreases the work function of the second layer 13. The active layer is made of a material selected from the group consisting of Cs, CsO and CsF.

The lower surface electrode 17 contacts the substrate 11.

Therefore, the energy bandgap of the substrate 11 is larger than that of the first layer 12. The energy bandgap of the second layer 13 is larger than that of the first layer 12. The energy bandgap of the third layer 14 is the same as that of the second layer 13. The photomultiplier has a closed (sealed) vessel V1. The closed vessel V1 has a glass tube 31 and a faceplate 34. The glass tube 31 and the faceplate 34 are bonded each other with a sealing material SEL. Light passes through the faceplate (predetermined portion) 34. A transparent electrode TR1 is coated on the inner surface of the predetermined portion. The photocathode is fixed to the glass tube 31 with an adhesive AD1. The transparent electrode TR1 and the lower surface electrode 17 are in contact with each other. The transparent electrode contacts a conductive film CL2 coated on the inner wall of the tube 31 and is connected to a pin P2 through the conductive film CL2 and a wire W1. The upper surface electrode is connected to a pin P1 through an internal conductive film CL1 and a wire W2. The internal conductive film CL1 is coated on the inner wall of the tube 31 to surround the space between a focusing electrode FE1 and the photocathode 10. The photomultiplier also has a plurality of pins PS extending through the vessel V1. These pins except for the pins P1 and P2 are respectively electrically connected to box-and-grid type dynodes (D1 to D7) and an anode A1, all of which are arranged in the vessel V1. The anode A1 is arranged near the ultimate stage dynode D7 and collects electrons s which are multiplied by these dynodes (D1 to D7). The dynodes D2 to D7 are arranged in a line from the first dynode D1. A secondary emitter SE1 is coated on the inner surface of each dynode.

When this photomultiplier is used, a potential higher than that of the lower surface electrode 17 is applied to the upper surface electrode 15, and a potential further higher than that of the upper surface electrode 15 is applied to the anode A1. The potentials applied to the dynodes D1 to D7 gradually become higher toward the ultimate stage.

Figure 2:
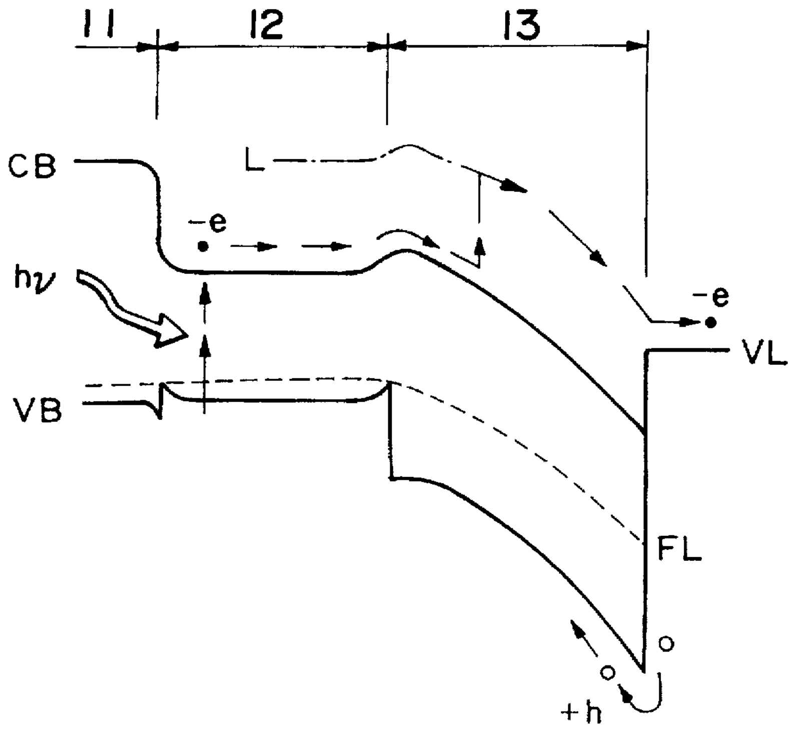
FIG. 2 is an energy band diagram obtained when a bias voltage is applied to the photoelectric emission surface according to the first embodiment.

FIG. 2 is an energy band diagram showing the energy state in the photoelectric emission surface at this time. As shown in FIG. 2, this energy band corresponds to the semiconductor substrate 11, the light absorbing layer 12, and the electron emission layer 13 from the left side. Referring to FIG. 2, the energy level at the peak of the valence band is represented by VB, the energy level at the bottom of the conduction band is represented by CB, and the Fermi level and the vacuum level are represented by FL and VL, respectively. When incident light hv is absorbed in the light absorbing layer 12, and photoelectrons -e are excited to the bottom of the Γ conduction band, the photoelectrons are accelerated by the electric field toward the emission surface. The photoelectrons obtain an energy upon this electric field acceleration and are transited, in the electron emission layer 13, from the bottom of the Γ valley of the conduction band to the bottom of an L or X conduction band at a higher energy level. The photoelectrons in this high energy state are emitted from the surface of the electron emission layer 13 into the vacuum. The incident light can be incident from the semiconductor substrate 11 side or electron emission layer 13 side.

In the photoelectric emission surface according to this embodiment, when a voltage is applied to the upper surface electrode 15 and the lower surface electrode 17, both of which are in ohmic contact, a depletion layer extends from the p-n junction portion into the photoelectric emission surface to form an electric field. Therefore, an unstable Schottky electrode which is conventionally required to apply a voltage to the photoelectric emission surface becomes unnecessary, and a stabler p-n junction can be used. For this reason, a photoelectric emission surface having desired characteristics can be obtained at a high reproducibility. Since the n-type contact layer 14 is fabricated into the same pattern as that of the upper surface electrode 15, the photoelectrons accelerated in the electron emission layer 13 are efficiently and easily emitted into the vacuum without being impeded with their traveling near the emission surface. According to this embodiment, the conventional problem of instability of the photoelectric conversion characteristics caused by the interface state between the Schottky electrode and the photoelectric emission surface is solved, and stable photoelectric conversion characteristics can be obtained at a much higher reproducibility. In addition, the photosensitivity of the obtained photoelectric emission surface can be increased.

Figure 3:
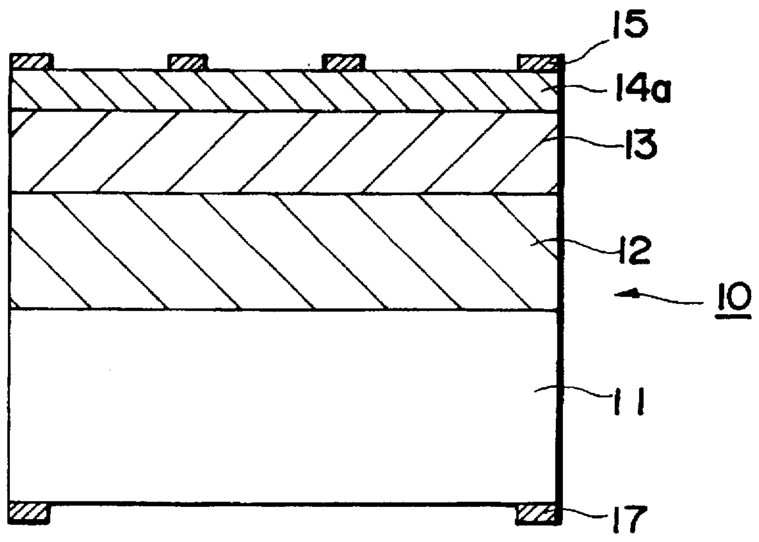
FIG. 3 is a sectional view of another photoelectric emission surface compared with the photoelectric emission surface according to the first embodiment so as to confirm its effectiveness.
Figure 4:
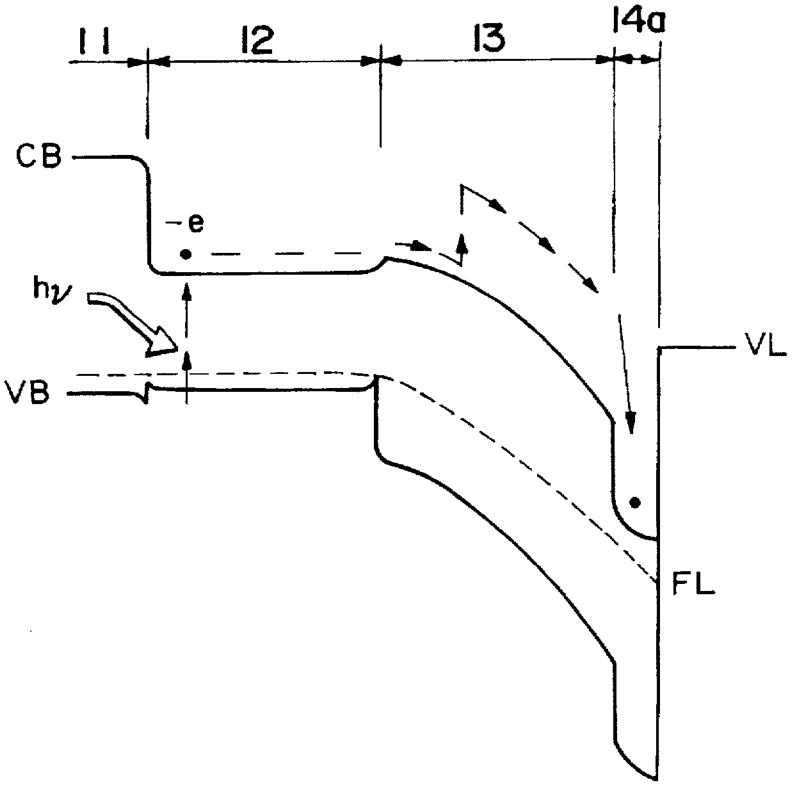
FIG. 4 is an energy band diagram obtained when a bias voltage is applied to the photoelectric emission surface shown in FIG. 3.

The contact layer 14 is also patterned into the same shape as that of the upper surface electrode 15. However, if a uniform contact layer 14*a* shown in the sectional view of FIG. 3 is formed on the surface of the electron emission layer 13, the higher photosensitivity as in this embodiment cannot be obtained. The same reference numerals as in FIG. 1 denote the same parts in FIG. 3, and a detailed description thereof will be omitted. FIG. 4 is an energy band diagram obtained when a predetermined bias voltage is applied between the electrodes of the photoelectric emission surface with this structure. In the photoelectric emission surface with the structure in which the contact layer 14*a* is uniformly formed, the photoelectrons transited to the L or X conduction band in the electron emission layer 13 tend to fall in the valley of the conduction band formed in the area of the contact layer 14*a*. For this reason, it becomes difficult to efficiently emit the photoelectrons generated upon incidence of the light hv into the vacuum, unlike this embodiment.

In the description of this embodiment, the InP/InGaAsP compound semiconductor is used as the material of the photoelectric emission surface. However, the present invention is not limited to this. For example, a semiconductor multilayered film material described in U.S. Pat. No. 3,958,143, such as CdTe, GaSb, InP, GaAsP, GaAlAsSb, and InGaAsSb, a heterostructure obtained by combining some of these materials, a heterostructure such as Ge/GaAs, Si/GaP, and GaAs/InGaAs, or a GaAs/AlGaAs multilayered film disclosed in Japanese Patent Laid-Open No. 5-234501 can also be used. As for the upper and lower surface electrodes, the AuGe/Ni/Au alloy material is used in the above embodiment. However, the present invention is not limited to this. The electrodes can be formed of any material as far as it is electrically in good ohmic contact with the underlaying semiconductor layer. Even when these materials are used to form a photoelectric emission surface, the same effect as that of this embodiment can be obtained.

In the description of the above embodiment, the upper surface electrode 15 and the contact layer 14 are patterned into a mesh-like shape. However, the present invention is not limited to this, and any pattern shape can be used as far as it allows almost uniform distribution and exposure of the surface of the electron emission layer 13. For example, a stripe or spiral shape may also be used. With a stripe shape, the surface of the electron emission layer 13 is almost uniformly distributed in a strip-like shape and exposed. With a spiral shape, the surface of the electron emission layer 13 is almost uniformly distributed in a spiral-like shape and exposed.

A photomultiplier having the photoelectric emission surface according to the present invention will be described below.

Figure 5:
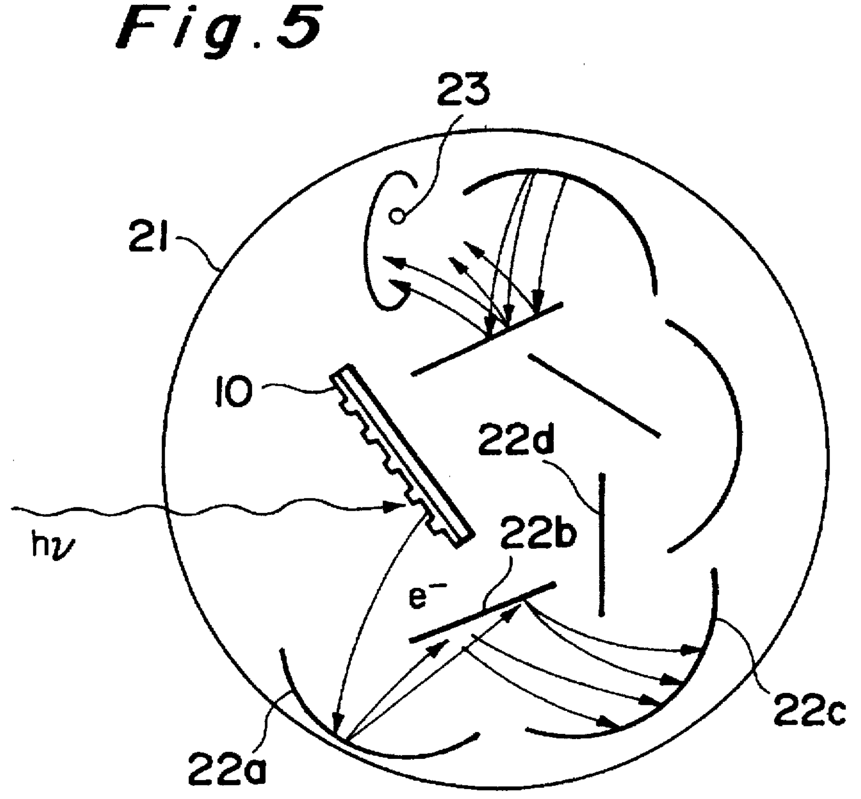
FIG. 5 is a sectional view of a photoelectric conversion tube according to the second embodiment in which the photoelectric emission surface according to the first embodiment is applied to a side-on type photomultiplier.

FIG. 5 is a sectional view schematically showing a photoelectric conversion tube according to the second embodiment of the present invention. In the second embodiment, a photoelectric emission surface 10 according to the first embodiment is used as the photoelectric surface of a side-on type photomultiplier. More specifically, the interior of a valve 21 of the photomultiplier is kept in a vacuum state. Photoelectrons excited in the light absorbing layer by incident light hv are accelerated by an internal electric field and emitted from the surface of the photoelectric emission surface 10 into the vacuum. The emitted photoelectrons are incident on a first dynode 22*a*, and secondary electrons are generated by the first dynode 22*a*. The secondary electron group is emitted into the vacuum again and incident on a second dynode 22*b*, thereby further multiplying the secondary electron group. Similarly, secondary electron multiplication of the photoelectrons is sequentially performed by dynodes 22*c*, 22*d*, . . . The photoelectrons are finally multiplied to $10^6$ times, reach an anode 23, and are extracted to the outside as a detection electrical signal.

When the photoelectric emission surface according to the present invention is applied to the photomultiplier, the following effects can be obtained. When the conventional photoelectric emission surface is used as the photoelectric surface of the photomultiplier, a Schottky electrode is required to the upper surface electrode for forming an electric field in the photoelectric emission surface. For this reason, the upper limit of the temperature in evacuation of the valve or baking processing in manufacturing the photomultiplier is 250° C. However, since an ohmic electrode is used as the electrode of the photoelectric emission surface according to the present invention, the upper limit of the temperature is raised to 350° C. When the photoelectric emission surface according to the present invention is applied, evacuation of the valve or baking can be performed at a higher temperature than that in the prior art. Therefore, the interior of the valve of the photomultiplier is further cleaned. This further improves the photosensitivity of the photomultiplier together with the improvement of the photosensitivity of the photoelectric emission surface itself. Actually, when the photosensitivity of the photomultiplier according to this embodiment is compared with that of the prior art, the photosensitivity is increased to about three times that of the prior art.

Figure 6:
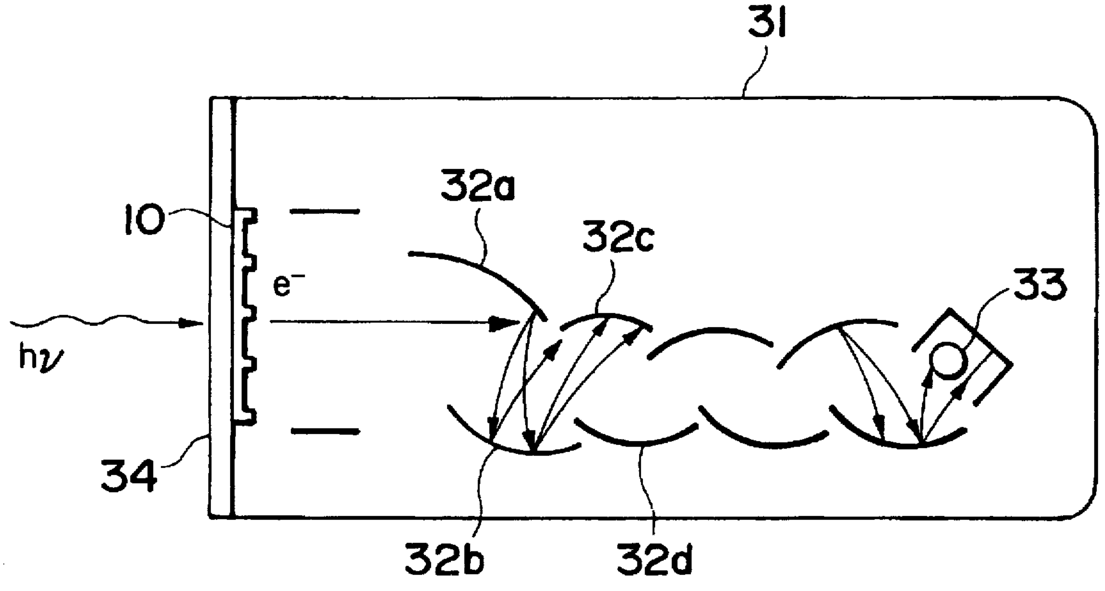
FIG. 6 is a sectional view of a photoelectric conversion tube according to the third embodiment in which the photoelectric emission surface according to the first embodiment is applied to a head-on type photomultiplier.

FIG. 6 is a sectional view schematically showing a photoelectric conversion tube according to the third embodiment. In the third embodiment, a photoelectric emission surface 10 according to the first embodiment is used as the photoelectric surface of a head-on type photomultiplier. More specifically, the interior of a valve 31 of the photomultiplier is kept in a vacuum state. Light hv is incident from the semiconductor substrate side of the photoelectric emission surface 10 through an input surface 34. Excited photoelectrons are emitted from the electron emission layer side into the vacuum. The emitted photoelectrons are incident on a first dynode 32*a* as in the above side-on type photomultiplier, and secondary electrons are generated. The secondary electron group is emitted into the vacuum again and incident on a second dynode 32*b*, thereby further multiplying the secondary electron group. Similarly, secondary electron multiplication of the photoelectrons is sequentially performed by dynodes 32*c*, 32*d*, . . . The photoelectrons reach an anode 33 and are extracted as an electrical signal.

Even in the photomultiplier according to the third embodiment, the same effects as those of the photomultiplier according to the second embodiment can be obtained. The interior of the valve of the photomultiplier is further cleaned, thereby improving the photosensitivity of the photomultiplier.

Note that a side-on type photomultiplier generally uses a so-called reflection type photoelectric emission surface while a head-on type photomultiplier generally uses a so-called transmission type photoelectric emission surface. However, the present invention is not necessarily limited to this.

Figure 7:
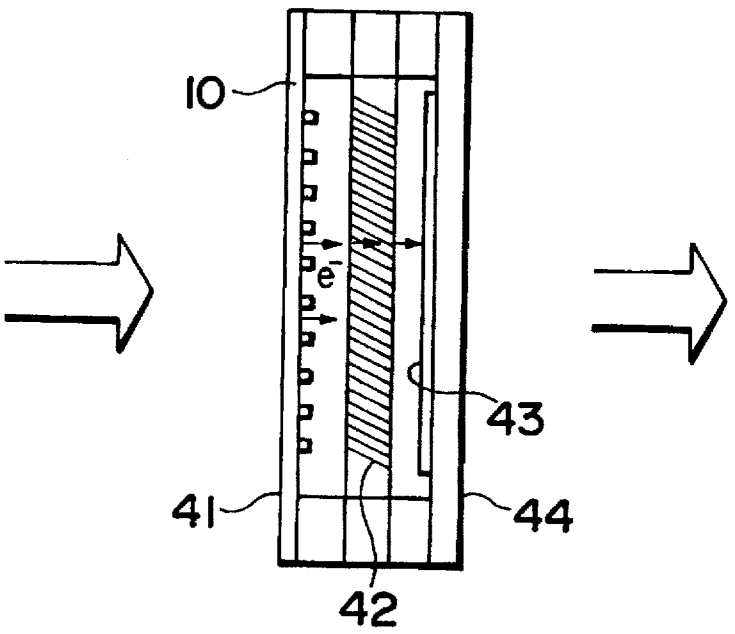
FIG. 7 is a sectional view of a photoelectric conversion tube according to the fourth embodiment in which the photoelectric emission surface according to the first embodiment is applied to the photoelectric surface of an image intensifier.

FIG. 7 is a sectional view schematically showing a photoelectric conversion tube according to the fourth embodiment of the present invention. In the fourth embodiment, a photoelectric emission surface 10 according to the first embodiment is used as the photoelectric surface of an image intensifier. More specifically, incident light is incident from the semiconductor substrate of the photoelectric emission surface 10 through an input surface 41. Excited photoelectrons are emitted from the electron emission layer side into a vacuum. Secondary electron multiplication of the emitted photoelectrons is performed not by dynodes but by a microchannel plate (MCP) 42, unlike the above embodiments. The photoelectrons obtained upon secondary electron multiplication cause light emission from a phosphor 43. The light-emission output is detected through an output surface 44. This image is intensified by the MCP 42. In such an image intensifier, two-dimensional position information can be obtained. However, the image intensifier operates on the basis of the same principle as that of the above-described photomultiplier.

Even in this embodiment, the same effects as those of the second and third embodiments can be obtained. More specifically, since the upper surface electrode of the photoelectric emission surface 10 is an ohmic electrode, evacuation and baking processing can be performed at a higher temperature, and the interior of the image intensifier is further cleaned. For this reason, the photoelectrons are efficiently emitted from the photoelectric emission surface 10. At the same time, secondary electron multiplication of the input image is performed without being affected by a pollutant. Therefore, in this image intensifier, an accurate and sharp intensified image can be obtained in correspondence with the input image.

Figure 8:
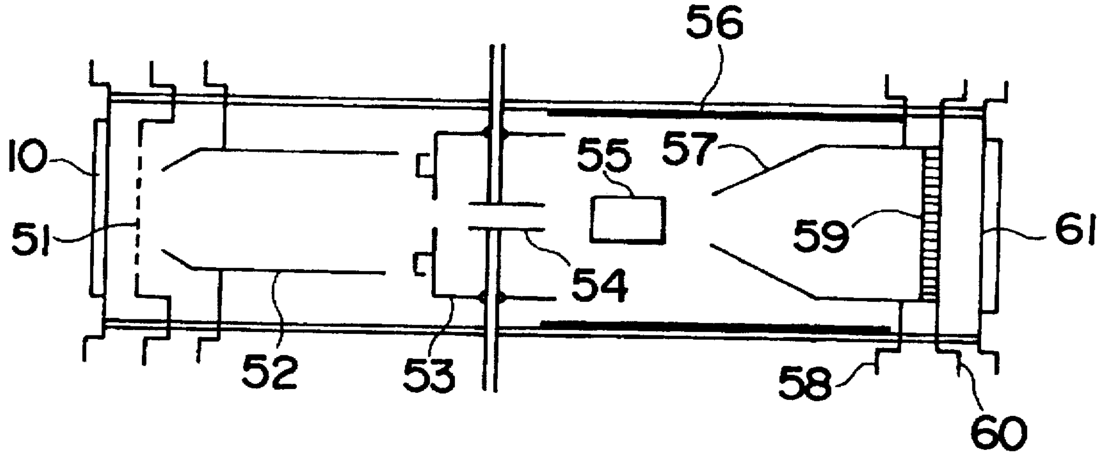
FIG. 8 is a sectional view of a photoelectric conversion tube according to the fifth embodiment in which the photoelectric emission surface according to the first embodiment is applied to the photoelectric surface of a streak tube.
Figure 9:
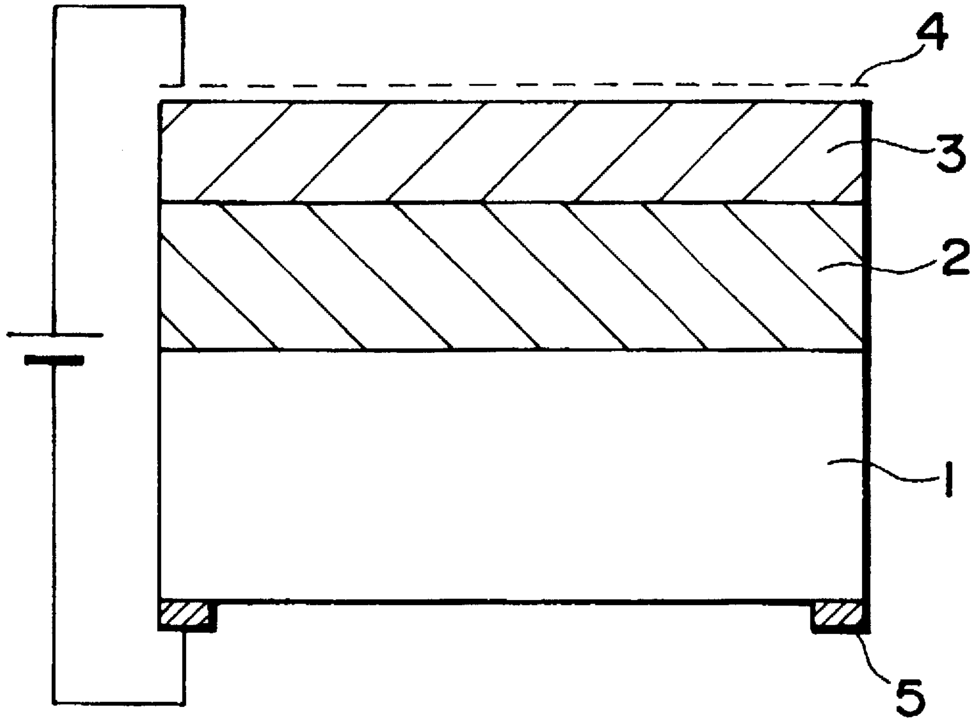
FIG. 9 is a sectional view of a photocathode.

FIG. 8 is a sectional view schematically showing a photoelectric conversion tube according to the fifth embodiment of the present invention. In the fifth embodiment, a photoelectric emission surface 10 according to the first embodiment is used as the photoelectric surface of a streak tube. More specifically, photoelectrons emitted from the photoelectric emission tube 10 are accelerated by an acceleration electrode 51, focused by a focusing electrode 52, and further accelerated by an anode electrode 53. The accelerated photoelectrons pass through a deflecting area formed by a deflecting electrode 54. Thereafter, the photoelectrons are guided to an MCP input terminal 58 by a position correction electrode 55, a wall anode 56, and a cone electrode 57, and incident on an MCP 59. Electron multiplication of the photoelectrons incident on the MCP 59 is performed. The photoelectrons are output onto a phosphor 61 through an MCP output terminal 60. As a result, a streak image is formed on the phosphor 61. Since a high-speed high sweep voltage synchronized with the electrons incident on the deflecting area is applied to the deflecting electrode 54, the deflection angle, i.e., the position on the phosphor 61 is determined in accordance with the time when the electrons are emitted from the photoelectric emission surface 10. Therefore, a time t of the incident light is converted into an ordinate y on the phosphor 61, and the intensity of the streak image is proportional to the incident light intensity.

Even in the streak tube according to the fifth embodiment, the same effects as those of the photoelectric conversion tubes according to the above embodiments can be obtained. The interior of the valve of the streak tube is further cleaned, thereby improving the photosensitivity of the streak tube.

Figure 11:
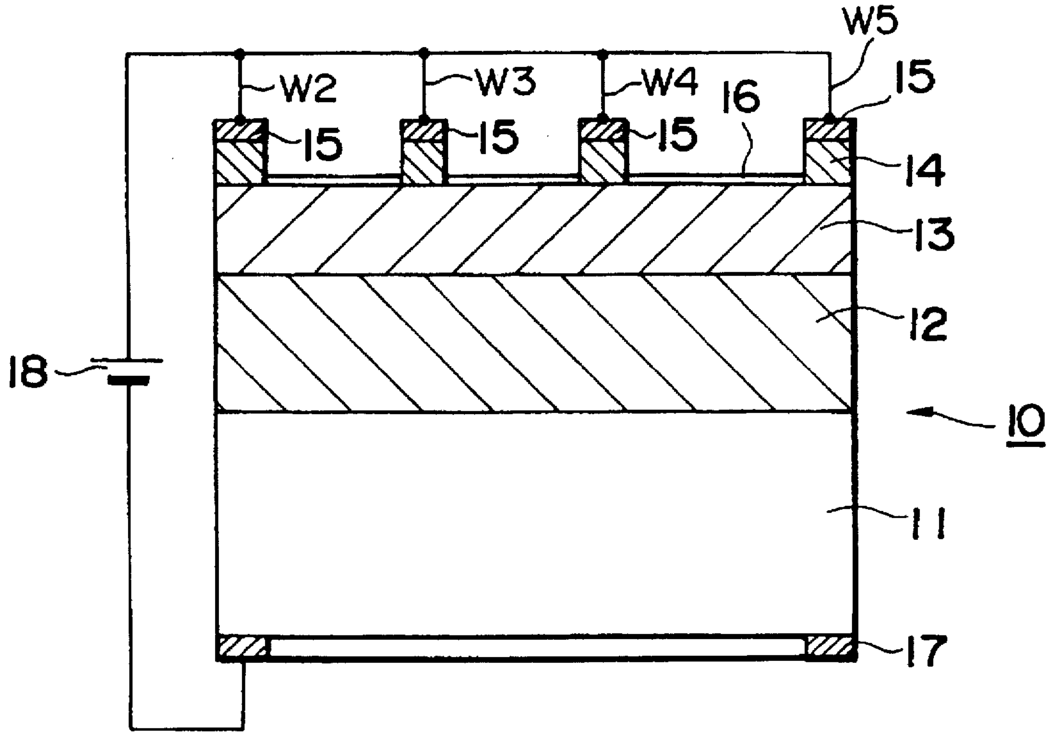
FIG. 11 is a sectional view of a photocathode according to the sixth embodiment.
Figure 12:
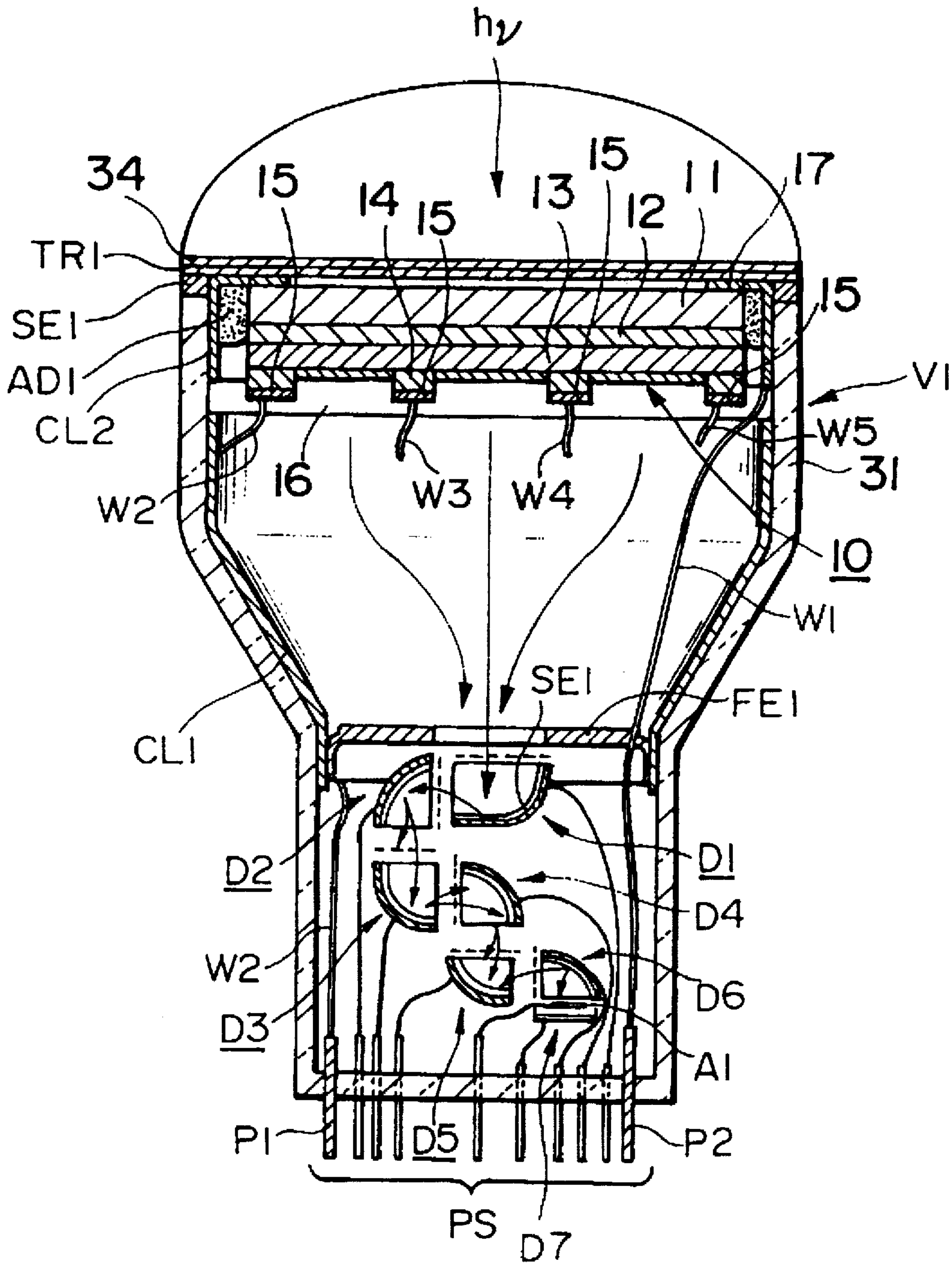
FIG. 12 is a sectional view of a photomultiplier having the photocathode according to the sixth embodiment.

The present invention is not limited to the above embodiments, i.e., as shown in FIG. 11, the photocathode may comprise a plurality of straight electrodes which forms stripe structure. In applying this photocathode to a photomultiplier, the respective electrodes which are electrically isolated from each other may be connected to wires W2 to W5, respectively, and each of the wires W2 to W5 is connected to the conductive film CL1 of the photomultiplier shown in FIG. 12.

Figure 13:
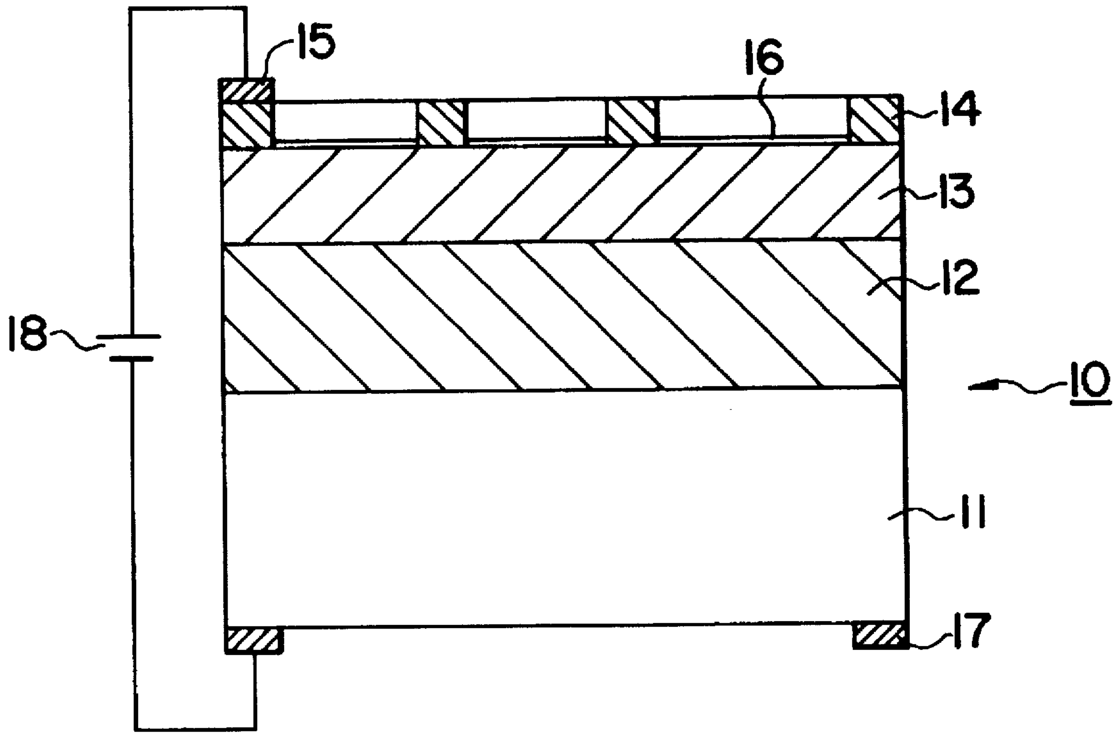
FIG. 13 is a sectional view of a photocathode according to the seventh embodiment.
Figure 14:
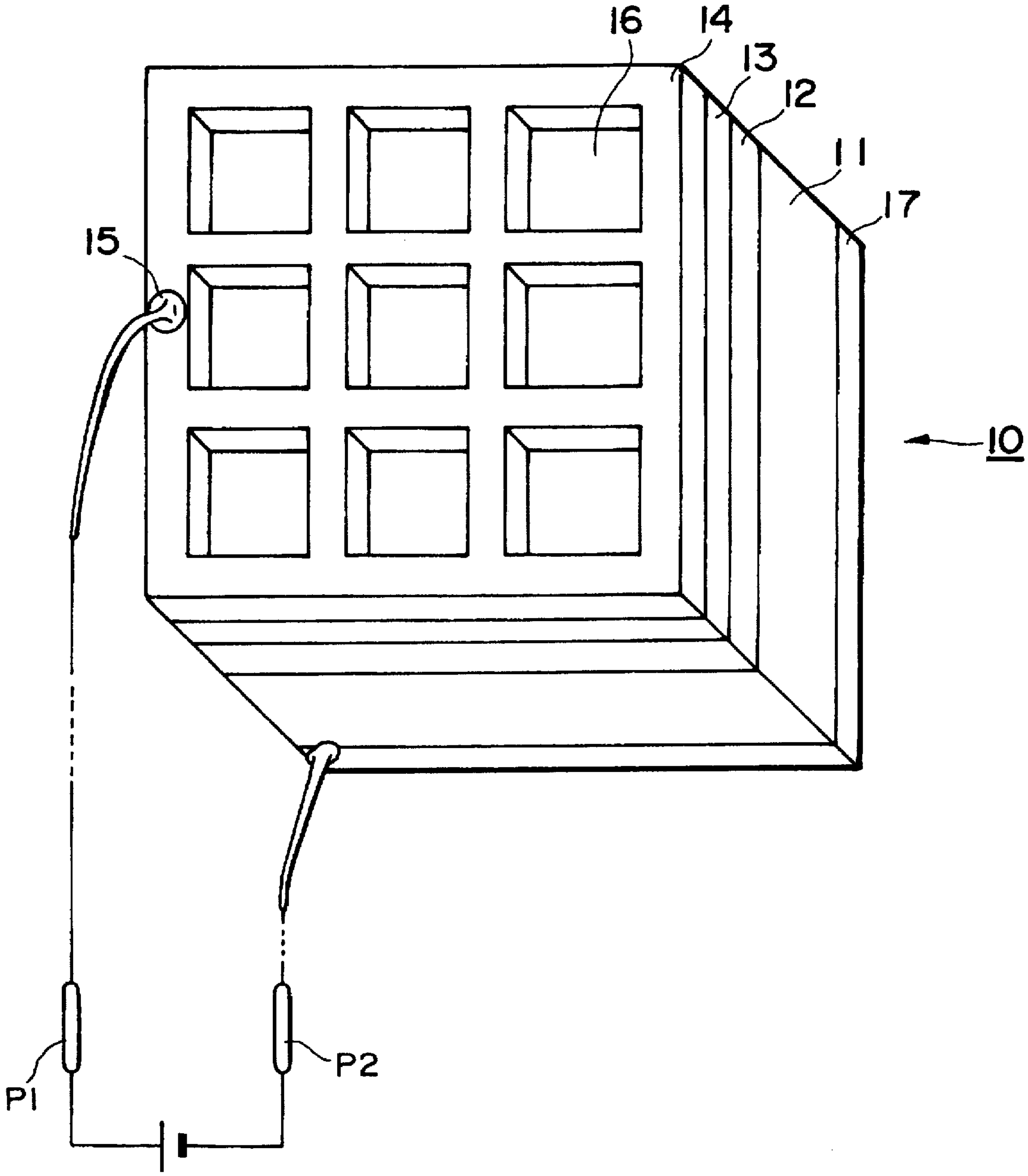
FIG. 14 is a perspective view of a photocathode according to the seventh embodiment.

Although each of the surface electrode according to the above embodiments is provided on the whole area of the surface of the third semiconductor layer 14, the surface electrode 15 may be in contact with a portion of the third semiconductor layer 14 as shown in FIG. 13. That is, the third semiconductor layer 14 forming a lattice structure and the surface electrode 15 is in contact at a small point. FIG. 14 is a perspective view of the photocathode of FIG. 13. As shown in FIG. 14, the surface electrode 17 is electrically connected to the pin P1 of the photomultiplier, and the back surface electrode 17 is electrically connected to the pin P2. When applying the photocathode having surface electrode 15 with a shape as shown in FIG. 1 to so-called reflection mode photocathode which receives incident light hν from its electron emitting side, a large part of the incident light is absorbed by electrode 15 and the amount of the incident light which reaches the light absorbing layer 12 us insufficient. However, as shown in FIG. 14, because the surface electrode 15 is formed only on a small region of the contact layer 14, the transmissivity of the incident light is not reduced and the photoelectric conversion coefficient is greatly increased.

Figure 15:
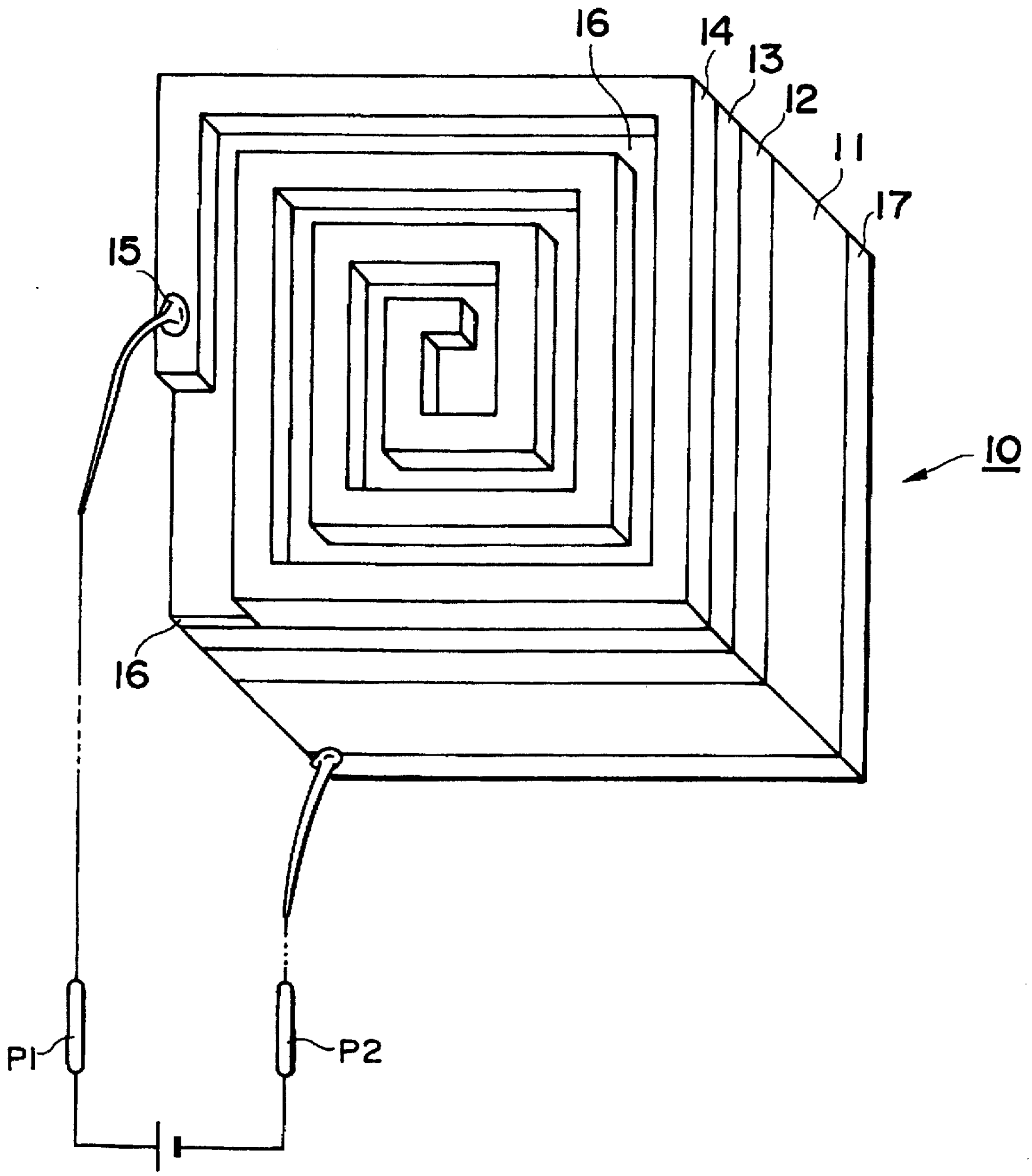
FIG. 15 is a perspective view of a photocathode according to the eighth embodiment.
Figure 16:
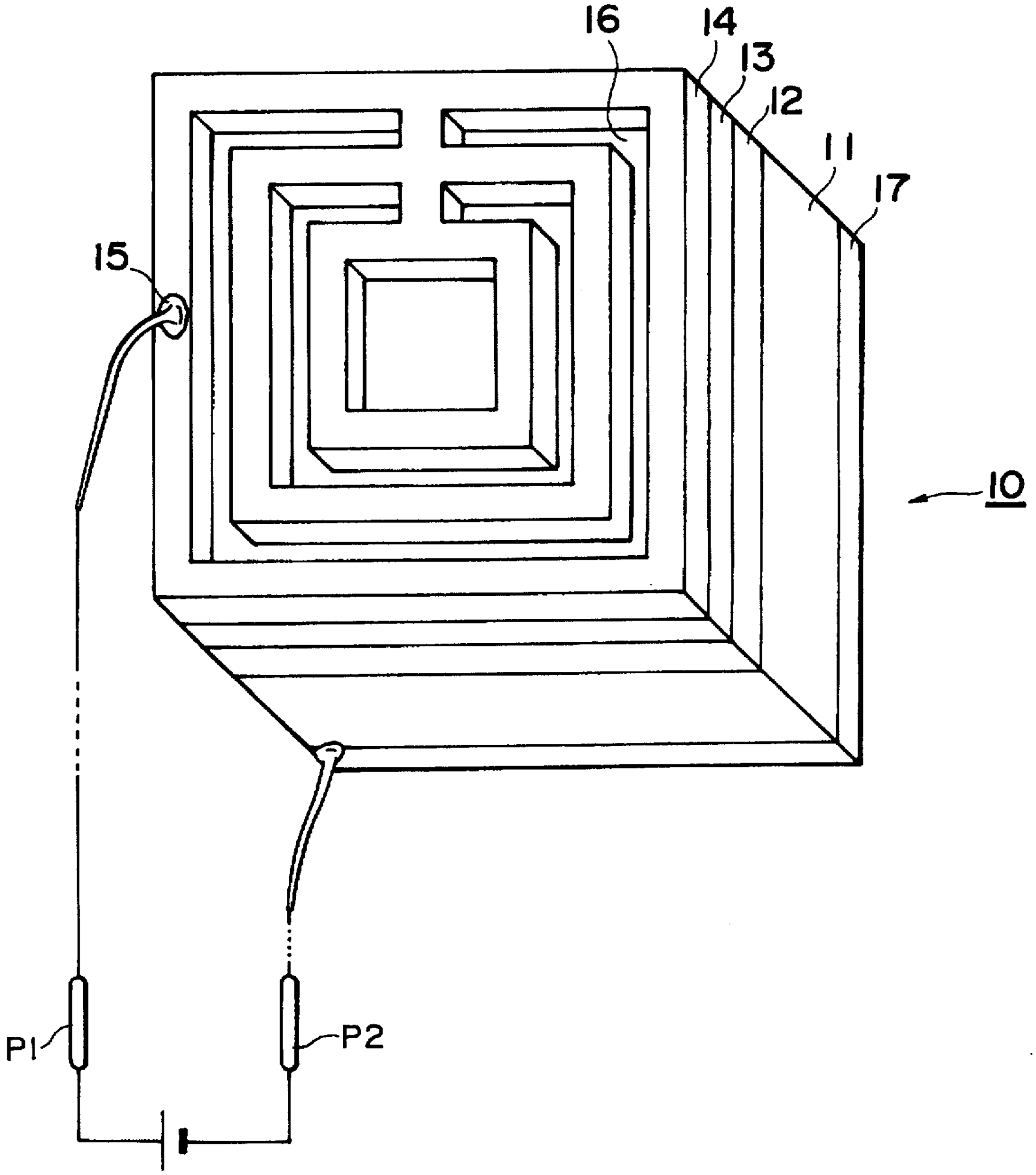
FIG. 16 is a perspective view of a photocathode according to the ninth embodiment.

Further, the shape of the third semiconductor layer 14 may be a spiral as shown in FIG. 15, and the shape of the third semiconductor electrode 14 may be in the form of concentric rectangles connected to each other as shown in FIG. 16.

Figure 17:
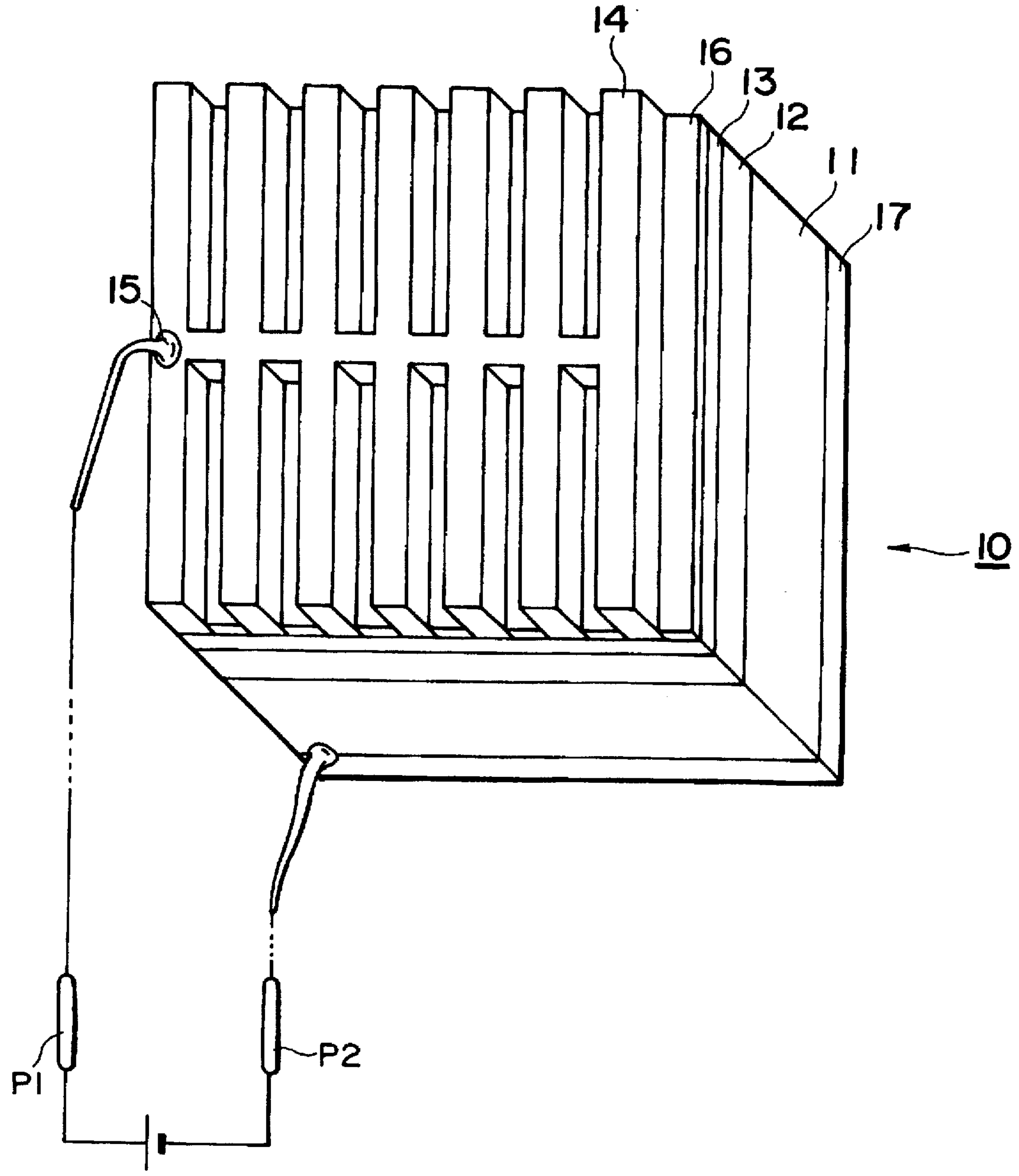
FIG. 17 is a perspective view of a photocathode according to the tenth embodiment.

Further, the shape of the third semiconductor layer 14 may be in the form of a layer consisting of a trunk and a branches extended from the trunk, in the so-called fish-bone structure, as shown in FIG. 17. Note that each of the above described photocathodes 10 may be applied to all of the above described electron tubes.

As has been described above, according to the present invention, when a bias voltage is applied to the upper surface electrode and the lower surface electrode, both of which are in ohmic contact, the p-n junction between the contact layer and the electron emission layer is reversely biased. A depletion layer extends from the p-n junction portion into the photoelectric emission surface, and an electric field for accelerating the photoelectrons is formed in the photoelectric emission surface. Therefore, a Schottky electrode which is conventionally required to apply a voltage to the photoelectric emission surface becomes unnecessary. For this reason, the conventional problem of instability of the photoelectric conversion characteristics caused by the interface state between the Schottky electrode and the photoelectric emission surface is solved.

Since the contact layer and the upper surface electrode have a pattern shape for almost uniformly distributing and exposing the electron emission layer, the photoelectrons excited in the light absorbing layer are efficiently emitted into the vacuum without being impeded with their traveling near the emission surface. For this reason, a photoelectric emission surface having a high photosensitivity can be obtained. Specially, because the upper surface electrode is formed only in a small region of the contact layer, the surface electrode does not interrupt the incident light hν and the transmissivity of the incident light is not decreased and photoelectric conversion coefficient is greatly increased.

According to the present invention, the stability and reproducibility of the photoelectric conversion characteristics, and a high photosensitivity are simultaneously satisfied.

When the photoelectric emission surface according to the present invention is applied to the photoelectric surface of the photoelectric conversion tube, the interior of the tube can be further cleaned in manufacturing the photoelectric conversion tube, thereby realizing a photoelectric conversion tube having a high photosensitivity.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 318182/1994 filed on Dec. 21, 1994, is hereby incorporated by reference.

What is claimed is:

1. A photomultiplier having a photocathode for emitting electrons in correspondence with light incident on said photocathode, wherein said photocathode comprises:

(a) a substrate of p-type InP, which has a carrier concentration of not less than $1\times10^{18}$ $cm^{-3}$;

(b) a first layer of p-type InGaAsP, which has a carrier concentration of not more than $5\times10^{16}$ $cm^{-3}$, being in contact with said substrate;

(c) a second layer of p-type InP, which has a carrier concentration of not more than $5\times10^{16}$ $cm^{-3}$, being in contact with said first layer;

(d) a third layer of n-type InP, which has a carrier concentration of not less than $1\times10^{18}$ $cm^{-3}$, being in contact with said second layer;

(e) an upper surface electrode having an opening, being in contact with said third layer;

(f) an active layer for decreasing a work function of said second layer, being in contact with a remaining exposed surface of said second layer; and (g) a lower surface electrode being in contact with said substrate.

2. A photomultiplier according to claim 1, wherein said active layer is comprised of Cs.

3. A photomultiplier according to claim 1, wherein said active layer is made of a material selected from the group consisting of CsO and CsF.

4. A photomultiplier according to claim 1, further comprising:

a) a sealed vessel which accommodates said photocathode;

b) a first stage dynode arranged in said sealed vessel;

c) a focusing electrode arranged between said first stage dynode and said photocathode;

d) a plurality of dynodes including an ultimate stage dynode and arranged contiguously from said first stage dynode; and e) an anode arranged near said ultimate stage dynode.

5. A photomultiplier according to claim 1, wherein a potential higher than that of said lower surface electrode is applied to said upper surface electrode.

6. A photomultiplier according to claim 4, further comprising an internal conductive film coated on an inner wall of said sealed vessel to surround a space between said focusing electrode and said photocathode and electrically connected to said upper surface electrode.

7. A photomultiplier according to claim 1, further comprising:

a) a sealed vessel which accommodates said photocathode, having a predetermined portion through which the light is input to said photocathode; and b) a transparent electrode coated on an inner surface of said predetermined portion of said sealed vessel and electrically connected to said lower surface electrode.

8. A photomultiplier having a photocathode for emitting electrons in correspondence with light incident on said photocathode, wherein said photocathode comprises:

(a) a substrate of a first conductivity type semiconductor, having a predetermined carrier concentration;

(b) a first layer of a first conductivity type semiconductor, having a first carrier concentration, being in contact with said substrate;

(c) a second layer of a first conductivity type semiconductor, having a second carrier concentration, being in contact with said first layer;

(d) a third layer of a second conductivity type semiconductor, having a third carrier concentration, being in contact with said second layer;

(e) an upper surface electrode being in contact with said third layer;

(f) an active layer for decreasing a work function of said second layer, being in contact with a remaining exposed surface of said second layer; and (g) a lower surface electrode being in contact with said substrate.

9. A photomultiplier according to claim 8, wherein an energy bandgap of said substrate is larger than that of said first layer, and the energy bandgap of said second layer is larger than that of said first layer.

10. A photomultiplier according to claim 8, wherein an energy bandgap of said third layer is equal to that of said second layer.

11. A photomultiplier according to claim 8, wherein the third concentration is higher than $1\times10^{18}$ $cm^{-3}$.

12. A photomultiplier according to claim 8, wherein said substrate is p-type InP, the predetermined carrier concentration is not less than $1\times10^{18}$ $cm^{-3}$, said first layer is p-type InGaAsP, the first carrier concentration is not more than $5\times10^{16}$ $cm^{-3}$, said second layer is p-type InP, the second carrier concentration is not more than $5\times10^{16}$ $cm^{-3}$, said third layer is n-type InP, and the third carrier concentration is not less than $1\times10^{18}$ $cm^{-3}$.

13. A photomultiplier according to claim 8, wherein said active layer is comprised of Cs.

14. A photomultiplier according to claim 8, wherein said active layer is comprised of a material selected from the group consisting of CsO and CsF.

15. A photomultiplier according to claim 8, further comprising:

a) a sealed vessel for accommodating said photocathode;

b) a first stage dynode arranged in said sealed vessel;

c) a focusing electrode arranged between said first stage dynode and said photocathode;

d) a plurality of dynodes including an ultimate stage dynode and arranged contiguously from said first stage dynode; and e) an anode arranged near said ultimate stage dynode.

16. A photocathode comprising:

(a) a substrate of a first conductivity type semiconductor, and having a predetermined carrier concentration;

(b) a first layer of a first conductivity type semiconductor, having a first carrier concentration, being in contact with said substrate;

(c) a second layer a first conductivity type semiconductor, having a second carrier concentration, being in contact with said first layer;

(d) a third layer consisting of a semiconductor of a second conductivity type, having a third carrier concentration, being in contact with said second layer;

(e) an upper surface electrode being in contact with said third layer;

(f) an active layer for decreasing a work function of said second layer, being in contact with a remaining exposed surface of said second layer; and (g) a lower surface electrode being in contact with said substrate.

17. A photocathode according to claim 16, wherein an energy bandgap of said substrate is larger than that of said first layer, and the energy bandgap of said second layer is larger than that of said first layer.

18. A photocathode according to claim 16, wherein an energy bandgap of said third layer is equal to that of said second layer.

19. A photocathode according to claim 16, wherein the third concentration is higher than $1\times10^{18}$ $cm^{-3}$.

20. A photocathode according to claim 16, wherein said substrate is p-type InP, the predetermined carrier concentration is not less than $1\times10^{18}$ $cm^{-3}$, said first layer is p-type InGaAsP, the first carrier concentration is not more than $5\times10^{16}$ $cm^{-3}$, said second layer is p-type InP, the second carrier concentration is not more than $5\times10^{16}$ $cm^{-3}$, said third layer is n-type InP, and the third carrier concentration is not less than $1\times10^{18}$ $cm^{-3}$.

21. A photocathode according to claim 16, wherein said active layer is Cs.

22. A photocathode according to claim 16, wherein said active layer is comprised of a material selected from the group consisting of CsO and CsF.

23. A photocathode according to claim 16, wherein said upper surface electrode having a point contact with said third layer.

* * * * *